United States Patent [19]

Braeckelmann

[11] 4,203,081
[45] May 13, 1980

[54] PASSIVE CIRCUIT ELEMENT FOR INFLUENCING PULSES

[75] Inventor: Walter Braeckelmann, Weidach, Fed. Rep. of Germany

[73] Assignee: Siemens Aktiengesellschaft, Berlin & Munich, Fed. Rep. of Germany

[21] Appl. No.: 887,652

[22] Filed: Mar. 17, 1978

[30] Foreign Application Priority Data

Mar. 31, 1977 [DE] Fed. Rep. of Germany ....... 2714426

[51] Int. Cl.$^2$ ...................... H03H 7/04; H03H 7/18; H03H 7/30
[52] U.S. Cl. ...................................... 333/138; 333/23; 333/140; 333/177; 333/184; 333/185
[58] Field of Search .............. 333/29, 70 S, 138, 140, 333/156, 161, 162, 23, 181, 184, 185; 336/200, 232

[56] References Cited

U.S. PATENT DOCUMENTS

| | | | |
|---|---|---|---|
| 2,178,653 | 11/1939 | Slade | 333/23 X |
| 3,105,209 | 9/1963 | Bundy | 333/78 |
| 3,436,687 | 4/1969 | Andrews, Jr. et al. | 333/84 X |
| 3,769,698 | 11/1973 | Lademann et al. | 336/200 X |
| 3,879,689 | 4/1975 | Seidel | 333/29 |

Primary Examiner—Alfred E. Smith
Assistant Examiner—Marvin Nussbaum
Attorney, Agent, or Firm—Hill, Van Santen, Steadman, Chiara & Simpson

[57] ABSTRACT

A passive circuit element for influencing pulses has two series-connected inductances which connect a first input terminal to a first output terminal, a first capacitor which is connected between the connection point of the inductances and the second terminals which are either directly connected to one another or which coincide with one another. The inductances are formed by spiral conductor paths which are arranged on a substrate and which are oppositely directed to one another. The spiral conductor paths are arranged concentrically above one another in two different conductor path layers which are separated by an insulating layer. The inner ends of the spiral conductor paths are connected by means of a contact extending through the insulating layer and to which a plate of the first capacitor is also connected.

3 Claims, 10 Drawing Figures

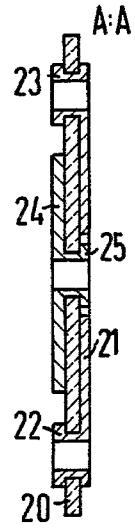
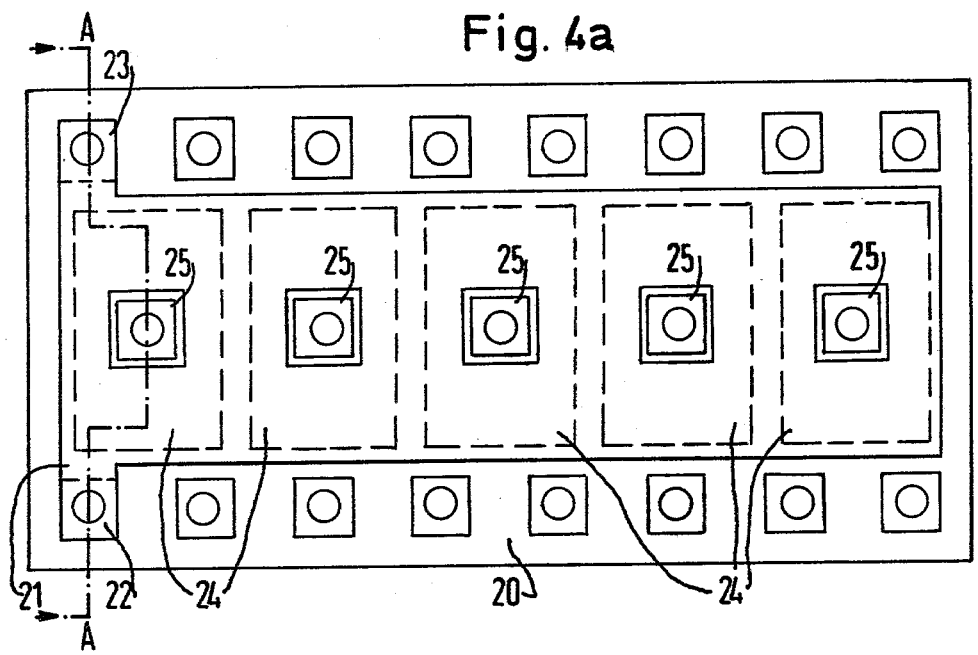
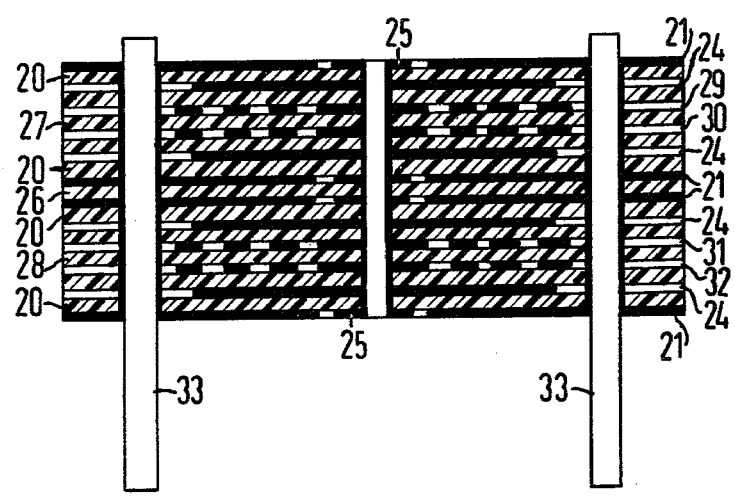

PASSIVE CIRCUIT ELEMENT FOR INFLUENCING PULSES

BACKGROUND OF THE INVENTION

1. Field of the Invention

The present invention relates to a circuit element for influencing pulses having two series-connected inductances which connect a first input terminal to a first output terminal, and having a first capacitor which is connected between the connection point of the inductances and the second terminals, the second terminals being either directly connected to one another or coincide with one another.

2. Description of the Prior Art

In complex data processing networks, in particular, it is occasionally necessary to delay pulses by electric time delay elements. Time delay elements of this type can be constructed, as is well known in the art, by four-terminal networks composed of coils and capacitors. In one such circuit, the series arm of the four-terminal network, i.e. between an input terminal and an output terminal, there is a series arrangement of two inductances. The shunt arm of the network is formed by a capacitor which is connected, on the one hand, to the junction of the two inductances and, on the other hand, to a direct link between a second input terminal and a second output terminal. The second input terminal and the second output terminal are not only electrically identical, but, in practice, frequently coincide and are provided as a single terminal. In order to steepen the edges of the pulses which are to be delayed, the inductances are often designed so that they are inductively coupled to each other. In addition, they can also be shunted by a second capacitor. In order to improve the pulse characteristic of the network, it is also known to connect a plurality of time delay elements, having correspondingly shorter delay times, in series, instead of achieving the desired delay time by a suitable dimensioning of a single delay network.

In other cases, it is necessary to flatten the pulse edges. Pulses having very steep edges can, in fact, give rise to undesirable disturbances. This happens, for example, when such pulses are transmitted simultaneously from a transmitting station over a main line, which is terminated correctly in respect of load impedance, to a plurality of receiving stations which are connected by way of nonterminated tap lines to the main line. As is known, a flattening of pulse edges can be achieved with low pass filters. However, it is necessary to accept a certain signal delay which, in most cases, is undesirable. A low pass filter differs from the delay element discussed above by virtue of the omission of the second-mentioned shunt capacitor and the absence, or at least substantial reduction, of the mutual coupling of the two inductances.

Time delay elements for signal delays in the order of a few nanoseconds are commercially available. A plurality of independent time delay elements having different delay times, e.g. 2, 4, 6 and 8 ns are accommodated in a single module in order to be able to select, as required, delay times of between 2 and 20 ns in steps of 2 ns. In these known time delay elements, the series inductances are formed by wound coils having a central tap. A design of this type is not only expensive but also occupies a relatively large amount of space.

SUMMARY OF THE INVENTION

The primary object of the present invention, therefore, is to provide time delay and low pass circuits in such a manner that they can be produced simply and thus inexpensively, and have a small space requirement. In particular, it is also to be possible to combine a plurality of elements to form modules in a simple fashion.

The above object is realized in an element of the type described above in which the inductances are formed by spiral conductor paths which are arranged on a substrate concentrically above one another in two different conductor path layers which are separated by an insulating layer, and by providing that the inner ends of the spiral conductor paths be connected through the insulating layer and also contact a plate of the shunt arm capacitor.

BRIEF DESCRIPTION OF THE DRAWINGS

Other objects, features and advantages of the invention, its organization, construction and operation will be best understood from the following detailed description taken in conjunction with the accompanying drawing, on which:

FIGS. 4a and 4b illustrate the reference position and the capacitor position of a module which comprises a plurality of circuit elements;

FIG. 5 is a sectional view taken through a module which comprises a plurality of circuit elements;

DESCRIPTION OF THE PREFERRED EMBODIMENTS

Figure 1:
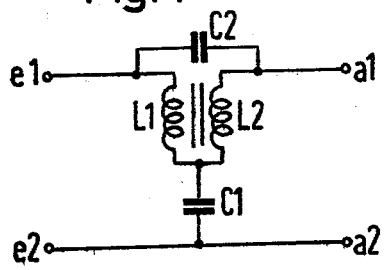
FIG. 1 is an equivalent electrical circuit diagram of a time delay element.

Referring to FIG. 1, an equivalent electrical circuit diagram of a time delay element, of the type discussed above, is illustrated. In the series arm of the four-terminal network, that is between the input terminal e1 and the output terminal a1 is a series arrangement of a pair of inductances L1 and L2. The shunt arm of the network is formed by a capacitor C1. The capacitor C1 is connected, on the one hand, to the junction of the two inductances L1 and L2 and, on the other hand, to the direct connection which extends between the input terminal e2 and the output terminal a2. As mentioned above, the terminals e2 and a2 are not only electrically identical, but, in practice, are frequently provided as a single terminal.

As also mentioned above, in order to steepen the edges of the pulses which are to be delayed, the inductances L1 and L2 are often designed such that they are inductively coupled together, as illustrated in FIG. 1. In addition, a capacitor C2 may also be provided to shunt the inductances. In order to improve the pulse characteristic, it is also known to connect a plurality of such networks in series with each element of the series having a shorter delay time, rather than to attempt to achieve a desired delay time by dimensioning the components of an individual time delay network.

Figure 2A:
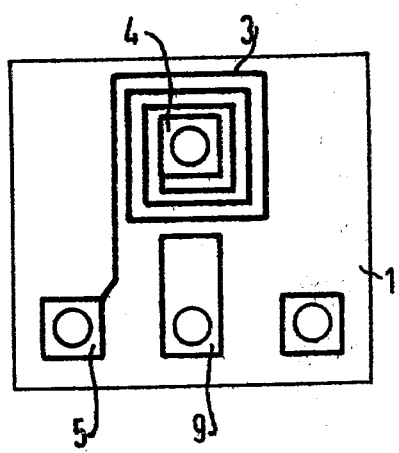
FIGS. 2a and 2b illustrate the conductor paths of a circuit element constructed according to the present invention for influencing pulses.
Figure 2B:
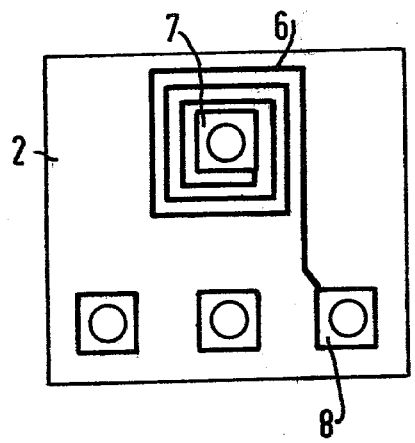

FIGS. 2a and 2b illustrate two substrate plates 1 and 2, each of which have conductor paths arranged thereon. A first conductor path is in the form of a spiral which has rectilinear portions extending between a contact 4 and a contact 5, the contact 5 corresponding to the input terminal e1 in FIG. 1. A second spiral conductor path 6, also having rectilinear portions, is arranged on the substrate plate 2 illustrated in FIG. 2b. The spiral conductor path 6 extends between an inner contact 7 and a contact 8, the contact 8 forming the output terminal a1 in FIG. 1. As is readily apparent from the drawing, the two conductor paths 3 and 6 have different directions of rotation. A contact 9 serves as a common ground terminal, and thus corresponds to the terminals e2 and a2 in FIG. 1. The capacitor C1 of FIG. 1 is later soldered between the contact 9 and the contact 4.

The network is completed by placing the two substrates 1 and 2 one above another and gluing the same together. The small circles within the contacts indicate apertures which have metallic-coated inner walls. With the aid of these through-contacts, commonly known as plated-through holes, the contacts which are arranged one above another are connected together. In particular, this forms a continuous winding having a uniform winding direction which continues from the contact 5 to the contact 8 by way of the contacts 4 and 7.

Terminal lugs (not illustrated on the drawing) are attached to the contacts 5, 8 and 9 and to the contact which is connected to the contact 9.

The conductor path layers can be produced, by the thick film technique or by the thin film technique on ceramic substrates, or by etching copper-lined epoxide or teflon plates. Naturally, the second conductor path layer can also be arranged on the same substrate on which the first conductor path is arranged. If, in this case, FIG. 2b were considered as the rear view of the substrate plate 1, the drawing would necessarily be homologous as is readily apparent to one skilled in the art.

Whether or not a circuit constructed in the manner described above should be assigned to a time delay element which comparatively strongly delays but only slightly deforms a pulse, or to a low pass filter in which the emphasis is upon the flattening of the pulse edges depends upon the spacing between the two coils, i.e. upon the thickness of the substrate (approximately 0.2–1 mm). Here, the stray capacitance which is effected between the two coils and the value of which is governed not only by the spacing between the coils but also by the dielectric constant of the substrate is also important. This divided capacitance also reduces, together with a reduction in the coil coupling.

Figure 3A:
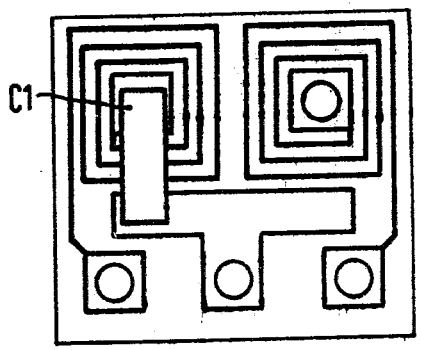
FIGS. 3a and 3b illustrate a chain composed of two circuit elements.
Figure 3B:
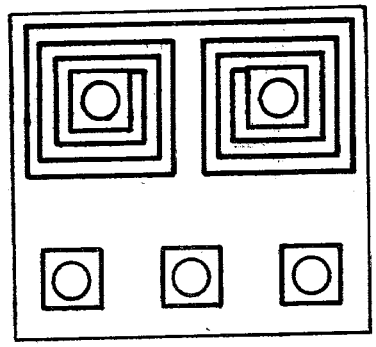

In FIGS. 3a and 3b, an arrangement which consists of two series-connected individual elements is illustrated. The drawing again shows the two conductor path layers, the design of which, including the course of the spiral-shaped individual coils, can be clearly seen from the drawing in combination with the description of FIGS. 2a and 2b. Further discussion of this structure is therefore not necessary. According to the two-element design, two capacitors C1 are now required, one of which is illustrated in FIG. 3a. Here, a so-called chip capacitor has been used for this example, in which the plates are arranged on both sides of a thin, flat substrate. An identical capacitor must be connected to the contact inside the right-hand spiral conductor path. In a sample embodiment of a two-element design, such as illustrated in FIGS. 3a and 3b, which design exhibited an overall transit time of 3 ns, the overall dimensions of the conductor path layers were 6×6 mm. Similarly to the exemplary embodiments described with reference to FIGS. 2a and 2b, 3a and 3b, it is also possible to provide arrangements in which a plurality of time delay elements, having different delay times, e.g. 2 and 4 ns or 2, 4 and 6 ns are combined.

The construction of coils by means of spiral-shaped conductor paths on a substrate has been well known in the art for quite some time. In this connection, one may refer to the British Pat. No. 1,180,923 for a teaching of how to produce windings for installation in shell cores composed of magnetic material by arranging a plurality of spiral conductor paths, initially connected in pairs, in a row on a strip-shaped, flexible substrate, and folding the substrate in such a manner that the spiral conductor paths lie one above another. Although the sub-windings formed by the individual spiral conductor paths are, in fact, inductively coupled to one another, the individual sub-windings and spiral conductor paths do not acquire any independent significance in respect of the production of specific inductances.

In the following, by way of a further exemplary embodiment of the invention, a module will be considered, which module is constructed in the manner of multilayer circuit boards having etched conductor paths and which internally contains 10 individual elements. Here, the capacitors C1 are formed in a known manner by the capacitance between two adjacent, large-area conductor path layers.

A capacitor arrangement of this type is illustrated in FIGS. 4a and 4b. In FIG. 4a a thin insulating layer 20 carries on its upper side (the side facing the observer in FIG. 4a) an extended conductor path 21, in addition to a number of contacts. The conductor path 21 merges into a pair of contacts 22 and 23 which are later connected to terminal pins which assume the role of the terminals a2 and e2 in FIG. 1 for all of the circuit elements combined in the module. On the rear side of the insulating layer 20 a plurality, here five conductor paths 24 are arranged which are separated from one another and which form identical capacitors in association with the conductor path 21, which in the following is referred to as the reference layer. The conductor paths 24 are connected via through-contacts to the contacts 25.

Figure 6:
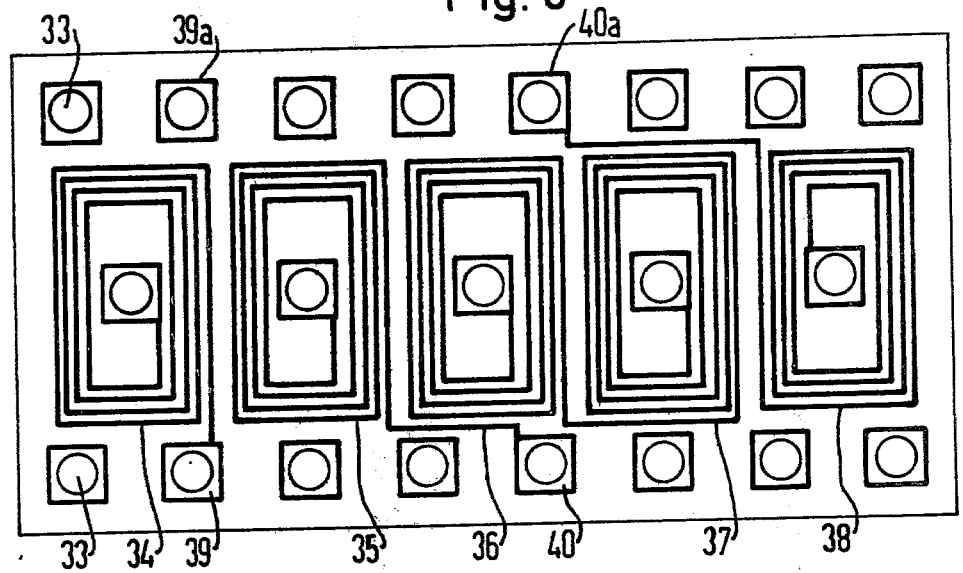
FIG. 6 illustrates a coil layer for a module which comprises a plurality of circuit elements.
Figure 7:
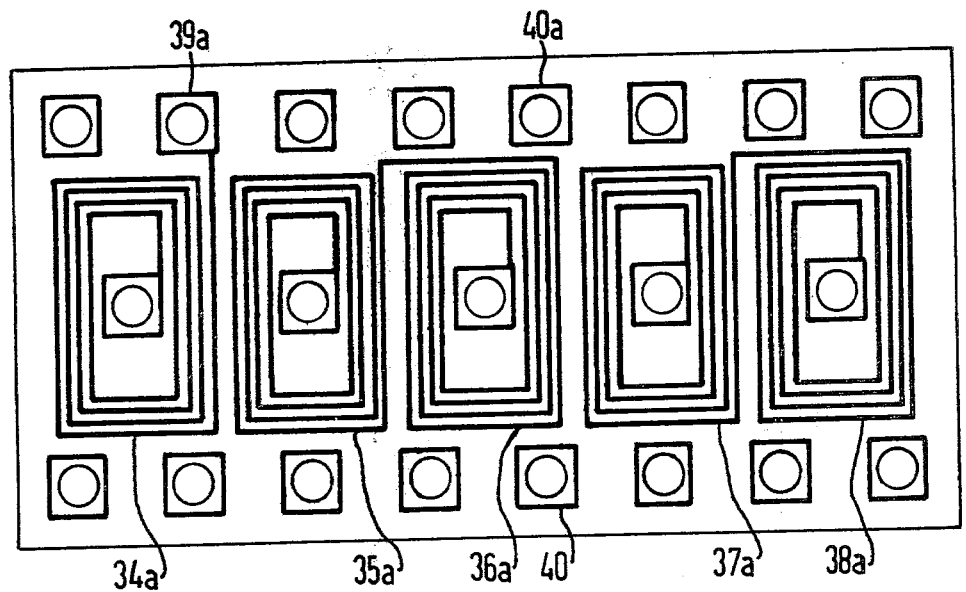
FIG. 7 illustrates another coil layer which is assigned to the coil layer illustrated in FIG. 6.

As illustrated in FIG. 4b, which is a sectional view along the parting line A—A in FIG. 4a, three layers are illustrated which form only a part of the overall structure of the module. The module has been illustrated in section in FIG. 5, and the sectional line extends in the same direction as the sectional line A—A in FIG. 4a. The module comprises, for example, twelve conductor path layers which have been represented by thickened black lines in the drawing. The conductor path layers are separated by insulating layers which, in contrast to FIG. 5, can also be of differing thicknesses in accordance with the particular requirements. The two outer and the two middle conductor path layers 21 form the reference layers and are connected to each other by way of through-contacts. Terminal pins 33 are inserted into the two outer bores, formed by the plated-through holes, whose inner wall metallizations serve as through-contacts. It can be seen from FIG. 5 that the module comprises two units which are identical in respect of the layer construction and which are separated by an insulating layer 26. The two units are externally sealed by a conductor path layer 21 (see FIG. 4b). The conductor paths of the two units are arranged symmetrically to the insulating layers 27 and 28. On both sides of the insulators 27 and 28 are arranged the conductor path layers 29, 30 and 31, 32 in whch the spiral conductor paths extend which form the coils. The structure of a conductor path layer of this type, for example of the conductor path 29, is illustrated in FIG. 6. In accordance with the division of the capacitor layer in FIG. 4a into five individual capacitors, here also provision has been made for individual spiral conductor paths 34-38, i.e. coils. The coils 34a-38a in the adjoining conductor path layer 30 (FIG. 5) which are in each case assigned to the first coils 34-38 are illustrated in FIG. 7. Depending upon the desired degree of coupling between the coils which are arranged one above another, the distance between the relevant conductor path layers is fixed by a suitable selection of the thicknesses of the insulating layer 27 (FIG. 5).

If the inner ends of the turns of the coils 34, 34a and 35, 35a, etc., assigned to one another are now considered to be connected to one another again by through-contacts, and if the direction of the turns or spiral conductor paths is followed with reference to FIGS. 6 and 7, it will be seen that an individual element is accessible between the terminal points 39 and 39a, whereas a chain of four individual elements lies between the terminal points 40 and 40a. In the second circuit unit which, in accordance with FIG. 5, comprises the lower half of the module, chains consisting of two and three individual elements, for example, could be formed. Furthermore, however, it should also be noted that the division into individual elements and chains of individual elements can be effected virtually arbitrarily, and it is only the number of available terminal points which can limit freedom of selection. Therefore, the module illustrated as an exemplary embodiment in FIGS. 4a-7 contains ten individual elements, but only five pairs of terminal points, since at least one terminal point is required for the connection of the reference layers.

It should also be noted that the circuit elements of the variety described above can also be integrated in wiring boards for general wiring purposes, such as circuit boards of flat assemblies or so-called rear wall wiring boards.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A passive circuit module, including passive circuit elements for influencing pulses, each of the circuit elements being of the type including a first input terminal, a first output terminal, and second input and output terminals which may be combined as a common terminal, and including a pair of inductances connected in series between the first input terminal and the first output terminal, and a capacitor connected between the junction of the inductances and the common terminal, the improvement therein comprising:

a plurality of circuit elements, each of said circuit elements comprising a plurality of spiral conductive paths forming the inductances, insulating substrate means including a first insulating layer carrying said spiral conductive paths such that the turns of one said spiral conductive paths are oppositely directed to the turns of the other spiral conductive paths and such that the paths are superposed with said first insulating layer therebetween;

a contact at the inner end of each spiral conductive path;

a metallized aperture extending through said contact for connecting the inner ends of the spiral paths to form a connecting junction of the inductances and to receive a connection to the capacitor;

said capacitance comprising first and second capacitors connected in parallel and including a second insulating layer and first and second conductive plate layers carried on opposite sides of said second insulating layer, a third insulating layer and third and fourth conductive plate layers carried on opposite sides of said third insulating layer, a fourth insulating layer separating said first conductive plate layer from one of said spiral conductive paths, a fifth insulating layer separating said third conductive plate layer from the other of said spiral conductive paths, said metallized aperture extending through said fourth and fifth conductive layers to connect said contacts of said inner ends of said spiral conductive paths to said first and third conductive plate layers, and an additional metallized aperture electrically connecting said second and fourth conductive plate layers.

2. The passive circuit module of claim 1, comprising a plurality of said passive circuit elements arranged next to one another in a single plane.

3. The passive circuit module of claim 1, comprising a plurality of said passive circuit elements arranged in two rows in superposed relation.

* * * * *